(12) United States Patent
Tsao et al.

(10) Patent No.: US 12,057,177 B2
(45) Date of Patent: *Aug. 6, 2024

(54) BIAS CONTROL FOR MEMORY CELLS WITH MULTIPLE GATE ELECTRODES

(71) Applicant: Taiwan Semiconductor Manufacturing Company, Ltd., Hsinchu (TW)

(72) Inventors: Szu-Chun Tsao, Hsinchu (TW); Jaw-Juinn Horng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 337 days.

This patent is subject to a terminal disclaimer.

(21) Appl. No.: 17/570,867

(22) Filed: Jan. 7, 2022

(65) Prior Publication Data

US 2022/0130470 A1    Apr. 28, 2022

Related U.S. Application Data

(63) Continuation of application No. 16/900,720, filed on Jun. 12, 2020, now Pat. No. 11,257,550.

(51) Int. Cl.
*G11C 16/30*      (2006.01)
*G11C 16/04*      (2006.01)

(52) U.S. Cl.
CPC .......... *G11C 16/30* (2013.01); *G11C 16/0483* (2013.01)

(58) Field of Classification Search
CPC ...................................................... G11C 16/30
(Continued)

(56) References Cited

U.S. PATENT DOCUMENTS 5,638,326 A    6/1997  Hollmer et al.
7,957,204 B1*  6/2011  Wu ........................ G11C 16/12
                                                    365/189.11
(Continued)

FOREIGN PATENT DOCUMENTS

CN        1610948 A     4/2005
CN      101350368 A     1/2009
(Continued)

OTHER PUBLICATIONS

Office Action issued in connection with Chinese Appl. No. 202010856724.1 dated Dec. 27, 2023.
(Continued)

*Primary Examiner* — Connie C Yoha
(74) *Attorney, Agent, or Firm* — FOLEY & LARDNER LLP (57) ABSTRACT

Disclosed herein are related to a memory device including a memory cell and a bias supply circuit providing a bias voltage to the memory cell. In one aspect, the bias supply circuit includes a bias memory cell coupled to the memory cell, where the bias memory cell and the memory cell may be of a same semiconductor conductivity type. The memory cell may include at least two gate electrodes, and the bias memory cell may include at least two gate electrodes. In one configuration, the bias memory cell includes a drain electrode coupled to one of the at least two gate electrodes of the bias memory cell. In this configuration, the bias voltage provided to the memory cell can be controlled by regulating or controlling current provided to the drain electrode of the bias memory cell.

20 Claims, 9 Drawing Sheets

(58) Field of Classification Search
USPC .................................................. 365/185.18
See application file for complete search history.

(56) References Cited

U.S. PATENT DOCUMENTS

| | | | |
|---|---|---|---|
| 10,147,488 B2 | 12/2018 | Hisamoto | |
| 11,257,550 B2* | 2/2022 | Tsao | G11C 16/0425 |
| 11,936,351 B2* | 3/2024 | Chen | H03F 3/45076 |
| 2002/0051387 A1 | 5/2002 | Kim | |
| 2015/0117109 A1 | 4/2015 | La Rosa et al. | |
| 2015/0279435 A1* | 10/2015 | Hsiao | G11C 7/10 365/189.05 |
| 2016/0078938 A1 | 3/2016 | Hsu | |
| 2016/0276038 A1 | 9/2016 | Kanda et al. | |
| 2018/0113812 A1 | 4/2018 | Luo et al. | |
| 2021/0375370 A1* | 12/2021 | Tsao | G11C 11/1673 |

FOREIGN PATENT DOCUMENTS

| | | |
|---|---|---|
| CN | 103927965 A | 7/2014 |
| CN | 104599714 A | 5/2015 |
| CN | 105989881 A | 10/2016 |
| CN | 107689244 A | 2/2018 |
| CN | 110073441 A | 7/2019 |
| DE | 10 2017 128 938 A1 | 7/2018 |

OTHER PUBLICATIONS

German Office Action on German Patent Application Ser. No. 1020101201.2 dated Jul. 21, 2021 (10 pages).

Non-Final Office Action on U.S. Appl. No. 16/900,720 dated Jun. 17, 2021 (12 pages).

Notice of Allowance on U.S. Appl. No. 16/900,720 DTD Oct. 18, 2021.

* cited by examiner

BIAS CONTROL FOR MEMORY CELLS WITH MULTIPLE GATE ELECTRODES

CROSS-REFERENCE TO RELATED APPLICATION

This application is a continuation of U.S. patent application Ser. No. 16/900,720, filed Jun. 12, 2020, the contents of which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, by but may lose the stored data once the power is shut off. Unlike volatile memory devices, non-volatile memory devices may retain data even after the power is shut off, but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory device includes a memory cell and a bias supply circuit providing a bias voltage to the memory cell. In one aspect, the bias supply circuit includes a bias memory cell coupled to the memory cell. In some embodiments, the bias memory cell and the memory cell are of a same semiconductor conductivity type. The memory cell may include at least two gate electrodes, and the bias memory cell may include at least two gate electrodes coupled to corresponding ones of the at least two gate electrodes. In one configuration, the bias memory cell includes a drain electrode coupled to one of the at least two gate electrodes of the bias memory cell. In this configuration, the bias memory cell can generate the bias voltage, according to a current provided to the drain electrode of the bias memory cell. According to the bias voltage, a current through the memory cell can be controlled or adjusted to ensure a stable operation (e.g., read, write, or reset) of the memory cell.

In some embodiments, the bias memory cell can provide the bias voltage to multiple memory cells. In one aspect, the bias supply circuit includes switches to selectively provide the bias voltage to the memory cells. For example, the bias supply circuit includes a first switch coupled between the one of the at least two gate electrodes of the bias memory cell and the one of the at least two gate electrodes of the memory cell. The bias supply circuit may also include a second switch coupled between the one of the at least two gate electrodes of the bias memory cell and one of at least two gate electrodes of another memory cell. Through the switches, the bias voltage can be selectively provided to the memory cells to perform various operations (e.g., read, write, or reset) of the memory cells.

Advantageously, the bias supply circuit can control current through the memory cells in an area efficient manner. In one implementation, a current provided to a memory cell can be controlled by employing a sense amplifier and a cascode transistor coupled to the memory cell in series. For example, the sense amplifier can sense a voltage at a drain electrode of the memory cell (or a source electrode of the cascode transistor) and adjust a voltage at a gate electrode of the cascode transistor according to the sensed voltage. However, implementing, for each memory cell, a corresponding cascode transistor and a corresponding sense amplifier can consume a large area. By employing a bias memory cell of a same type of the memory cells and generating a bias voltage by the bias memory cell for the memory cells as disclosed herein, cascode transistors and sense amplifiers for memory cells can be omitted to achieve area efficiency.

Figure 1:
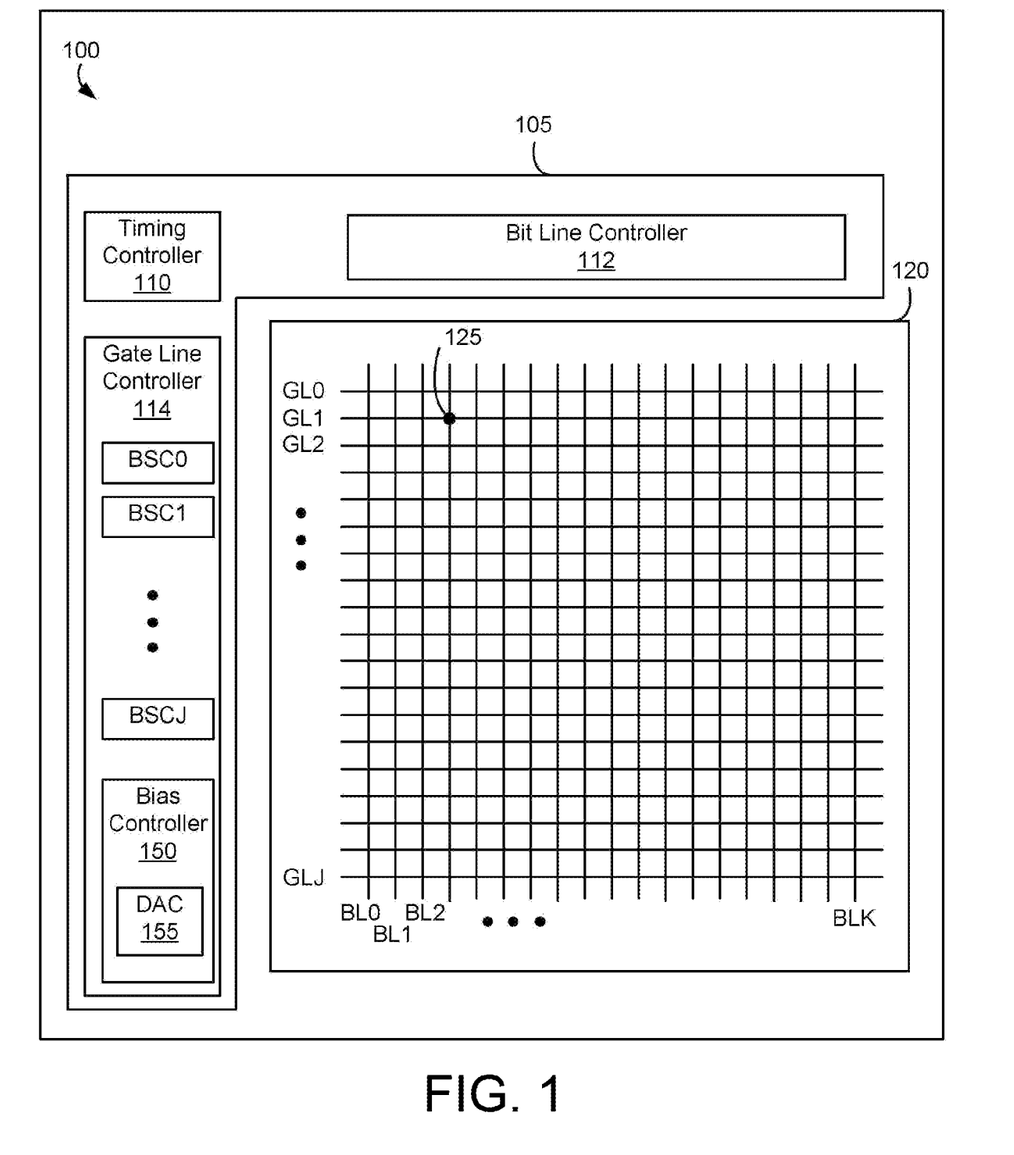
FIG. 1 is a diagram of a memory device, in accordance with one embodiment.

FIG. 1 is a diagram of a memory device 100, in accordance with one embodiment. In some embodiments, the memory device 100 is implemented as an integrated circuit. In some embodiments, the memory device 100 includes a memory controller 105 and a memory array 120. The memory array 120 may include a plurality of storage units or storage circuits 125 arranged in two- or three-dimensional arrays. Each storage circuit may be coupled to a corresponding gate line GL and a corresponding bit line BL. Each gate line may include any conductive material. The memory controller 105 may write data to or read data from the memory array 120 according to electrical signals through gate lines GL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device. The memory array 120 includes a plurality of storage units or storage circuits 125. In some embodiments, the memory array 120 includes gate lines GL0, GL1 ... GLJ, each extending in a first direction (e.g., X-direction) and bit lines BL0, BL1 ... BLK, each extending in a second direction (e.g., Y-direction). The gate lines GL and the bit lines BL may be conductive metals or conductive rails. In one aspect, each storage circuit 125 is coupled to a corresponding gate line GL and a corresponding bit line BL, and can be operated according to voltages or currents through the corresponding gate line GL and the corresponding bit line BL. In one aspect, each storage circuit 125 includes a flash memory cell with at least two gate electrodes. In some embodiments, the memory array 120 includes additional lines (e.g., select lines, reference lines, reference control lines, power rails, etc.).

The memory controller 105 is a hardware component that controls operations of the memory array 120. In some embodiments, the memory array 120 includes a bit line controller 112, a gate line controller 114, and a timing controller 110. In one configuration, the gate line controller 114 is a circuit that provides a voltage or a current through one or more gate lines GL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the gate line controller 114. The bit line controller 112 may be coupled to bit lines BL of the memory array 120, and the gate line controller 114 may be coupled to gate lines GL of the memory array 120. In one example, to write data to a storage circuit 125, the gate line controller 114 provides a voltage or current to the storage circuit 125 through a gate line GL coupled to the storage circuit 125, and applies a voltage or current corresponding to data to be stored to the storage circuit 125 through a bit line BL coupled to the storage circuit 125. In one example, to read data from a storage circuit 125, the gate line controller 114 provides a voltage or a current to the storage circuit 125 through a gate line GL coupled to the storage circuit 125, and senses a voltage or a current corresponding to data stored by the storage circuit 125 through a bit line BL coupled to the storage circuit 125. In some embodiments, the memory controller 105 includes more, fewer, or different components than shown in FIG. 1.

The gate line controller 114 is a hardware component that provides a bias voltage to the storage circuits 125. In some embodiments, the gate line controller 114 includes bias supply circuits BSC0, BSC1 ... BSCJ and a bias controller 150. Each of the bias supply circuit BSC may be configured to provide a bias voltage to a corresponding set of storage circuits 125, according to one or more control signals from the bias controller 150. In one example, each bias supply circuit BSC is coupled to a set of storage circuits 125 through one or more gate lines. For example, a bias supply circuit BSC0 is coupled to 64 or 128 number of storage circuits 125. In some embodiments, each storage circuit 125 includes at least two gate electrodes, and each gate line GL includes multiple gate lines, through which the bias supply circuit BSC can electrically couple to the storage circuit 125. For example, the gate line GL0 includes three gate lines (e.g., word line, control gate line, and erase gate line), though which the bias supply circuit BSC0 can perform operation on the storage circuit 125 according to control signals from the bias controller 150. In some embodiments, the bias controller 150 includes a digital to analog converter (DAC) 155 for configuring operations of the bias supply circuit BSC. For example, the DAC 155 can generate, for each switch (e.g., S1, S2, S3, S4, S11 ... S1K, S31 ... S3K) of a bias supply circuit BSC, an analog voltage corresponding to a target state of the switch as a control signal, and provide the control signal to the switch to execute various operations disclosed herein. Detailed descriptions on configurations and operations of bias supply circuits BSC and the storage circuits 125 are provided below with respect to FIGS. 2 through 9.

Figure 2:
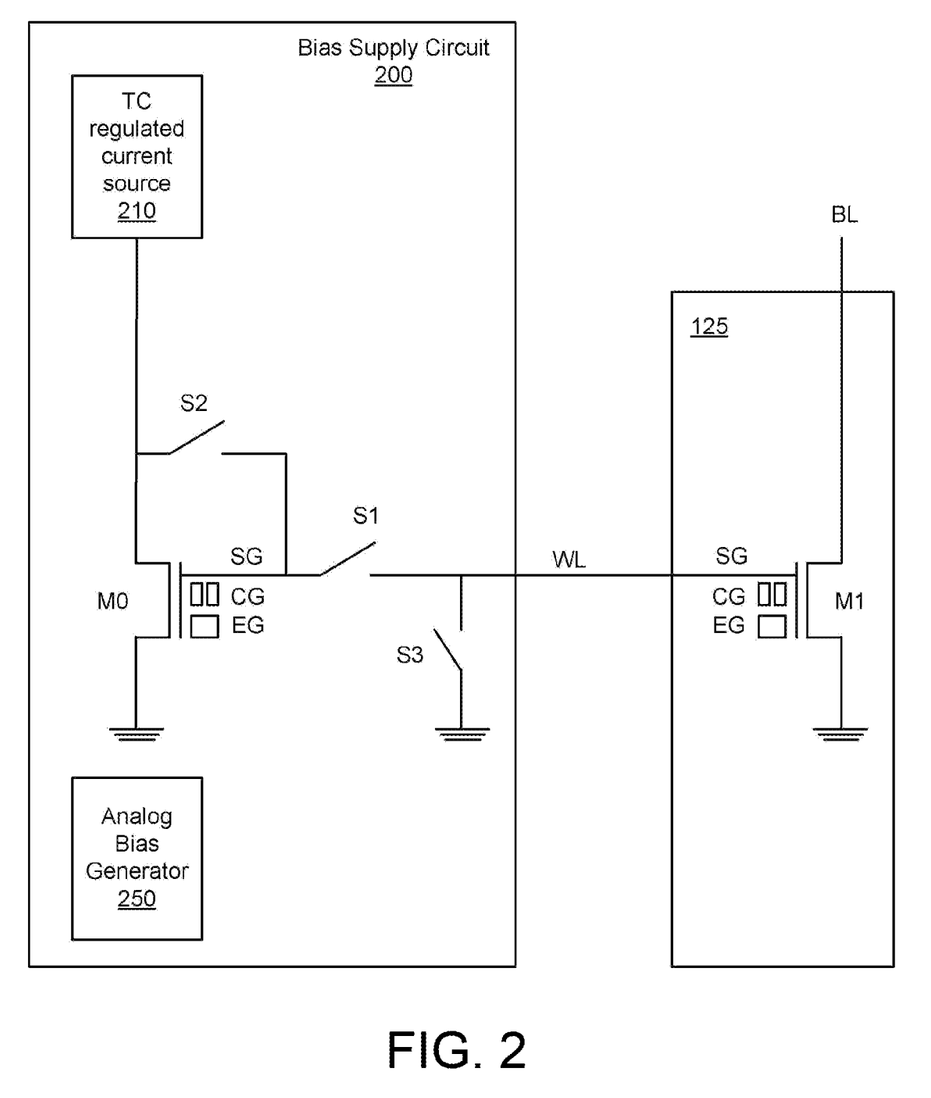
FIG. 2 is a diagram of a bias supply circuit and a storage circuit, in accordance with one embodiment.

FIG. 2 is a diagram of a bias supply circuit 200 and a storage circuit 125, in accordance with one embodiment. The bias supply circuit 200 may be a bias supply circuit BSC of FIG. 1. In some embodiments, the bias supply circuit 200 generates and provides a bias voltage to the storage circuit 125. The bias supply circuit 200 may provide the bias voltage to other storage circuits 125.

The storage circuit 125 is a circuit component that stores data, and/or outputs the stored data, according to the bias voltage from the bias supply circuit 200. In some embodiments, the storage circuit 125 includes a memory cell M1. The memory cell M1 may be a flash memory cell with at least two gate electrodes coupled to the bias supply circuit 200, a drain electrode coupled to a bit line BL, and a source electrode coupled to a power rail for providing a supply voltage (e.g., GND or VSS) or a sense line. In one example, the memory cell M1 includes a split gate electrode SG, a control gate electrode CG, and an erase gate electrode EG coupled to the bias supply circuit 200. To perform operations on the memory cell M1, various voltages can be applied to the gate electrodes. In one aspect, operations on the memory cell M1 can be performed according to a bias voltage applied to the split gate electrode SG and a threshold voltage of the memory cell M1, where the threshold voltage of the memory cell M1 may be determined according to a difference between a voltage at the control gate electrode CG and a voltage at the erase gate electrode EG of the memory cell M1. For example, to store data, 1V, 8V and 4V can be applied to the gate electrodes SG, CG, EG, respectively. For example, to read data, 1.1V, 0.8V and 0V can be applied to the gate electrodes SG, CG, EG, respectively. For another example, to erase data, 0V, 0V and 8V can be applied to the gate electrodes SG, CG, EG, respectively.

The bias supply circuit 200 is a circuit component that provides the bias voltage to the memory cell M1. In some embodiments, the bias supply circuit 200 includes a temperature coefficient regulated current source 210, a bias memory cell M0, and an analog bias generator 250. In some embodiments, the temperature coefficient regulated current source 210, the analog bias generator 250 or both are implemented as separate components from the bias supply circuit 220. In these embodiments, the gate line controller 114 may include one or more temperature coefficient regulated current sources 210 and/or one or more analog bias generators 250 that are shared among multiple bias supply circuits BSC.

In one aspect, the bias memory cell M0 is of a same type of the memory cell M1, such that the bias memory cell M0 and the memory cell M1 have the same or similar characteristics. In one configuration, the bias memory cell M0 includes gate electrodes (e.g., SG, CG, EG) coupled to respective gate electrodes (e.g., SG, CG, EG) of the memory cell M1. In some embodiments, the split gate electrode SG of the bias memory cell M0 is coupled to the split gate electrode SG of the memory cell M1 through the switch S1 and a word line WL. In some embodiments, the control gate electrode CG of the bias memory cell M0 is directly coupled to the control gate electrode CG of the memory cell M1 through a control line CL without any active component (e.g., switch) between them, and the erase gate electrode EG of the bias memory cell M0 is directly coupled to the erase gate electrode EG of the memory cell M1 through an erase line EL without any active component (e.g., switch) between them. The bias memory cell M0 further includes a source electrode coupled to the power rail providing a supply voltage (e.g., GND or VSS), and a drain electrode coupled to i) a temperature coefficient regulated current source 210 and ii) the split gate electrode SG of the bias memory cell M0. The temperature coefficient regulated current source 210 may be a bandgap circuit or any circuit that provides a controlled or regulated current over a temperature range (e.g., −40° C. to 150° C.). The analog bias generator 250 may be a circuit that provides analog voltages to the gate electrodes CG, EG of the bias memory cell M0 and the memory cell M1 for performing various operations (e.g., read, write, erase data) as described above. In this configuration, according to a current supplied by the temperature coefficient regulated current source 210, a bias voltage controlled or regulated over the temperature range can be generated at the split gate electrode SG. The bias voltage generated by the bias memory cell M0 can be provided to the memory cell M1, and cause a current corresponding to the bias voltage to flow through the memory cell M1, thereby allowing reliable operations of the memory cell M1 across a temperature range (e.g., −40° C. to 150° C.).

In some embodiments, the bias supply circuit 200 further includes switches S1, S2, S3 to selectively provide the bias voltage to the memory cell M1 and perform operations of the memory cell M1. The switches S1, S3, S3 may be controlled according to control signals from the bias controller 150. The switches S1, S2, S3 may be implemented as a transistor (e.g., metal-oxide-semiconductor field-effect transistor or any type of transistor). In some embodiments, the bias supply circuit 200 includes additional or less switches than shown in FIG. 2. In some embodiments, the switches S1, S2, S3 may be arranged in a different configuration than shown in FIG. 2.

In one configuration, the switch S1 is disposed between the split gate electrode SG of the bias memory cell M0 and the split gate electrode SG of the memory cell M1. In this configuration, the switch S1 may be enabled to electrically couple the split gate electrode SG of the bias memory cell M0 to the split gate electrode SG of the memory cell M1 to provide the bias voltage from the bias memory cell M0 to the memory cell M1. For example, the switch S1 may be disabled to electrically decouple the split gate electrode SG of the bias memory cell M0 from the split gate electrode SG of the memory cell M1 to electrically isolate the memory cell M1 from the bias memory cell M0.

In one configuration, the switch S2 is disposed between the drain electrode of the bias memory cell M0 and the split gate electrode SG of the bias memory cell M0. In this configuration, the switch S2 may be enabled to electrically couple the drain electrode of the bias memory cell M0 to the split gate electrode SG of the bias memory cell M0, such that the bias memory cell M0 can generate the bias voltage at the split gate electrode SG of the bias memory cell M0. For example, the switch S2 may be disabled to electrically decouple the drain electrode of the bias memory cell M0 from the split gate electrode SG of the bias memory cell M0 to electrically isolate the drain electrode of the bias memory cell M0 from the split gate electrode SG of the bias memory cell M0.

In one configuration, the switch S3 is disposed between the split gate electrode SG of the memory cell M1 and a power rail for providing a supply voltage (e.g., GND or VSS). In this configuration, the switch S3 may be enabled to electrically couple the split gate electrode SG of the memory cell M1 to the power rail to discharge the split gate electrode SG of the memory cell M1. For example, a voltage at the split gate electrode SG of the memory cell M1 can be set to the supply voltage of the power rail by enabling the switch S3, in response to the switch S1 being disabled. For example, the switch S3 may be disabled to electrically decouple the split gate electrode SG of the memory cell M1 from the power rail to electrically isolate the split gate electrode SG of the memory cell M1 from the power rail, in response to the switch S1 being enabled.

In one approach, the bias controller 150 enables the switch S2 such that the bias memory cell M0 can be arranged in a diode-connected configuration and cause the bias memory cell M0 to generate the bias voltage, according to the current from the temperature coefficient regulated current source 210. During a first time period while the switch S2 is enabled, the bias controller 150 may enable the switch S1 and disable the switch S3 to provide the bias voltage to the memory cell M1. According to the bias voltage applied, various operations (e.g., read, write, or reset) of the memory cell M1 can be performed. During a second time period while the switch S2 is enabled, the bias controller 150 may disable the switch S1 and enable the switch S3 to discharge the split gate electrode SG of the memory cell M1. After the second time period, the bias controller 150 may disable the switch S2 such that a voltage at the split gate electrode SG of the memory cells M0 is no longer controlled or affected by the current from the temperature coefficient regulated current source 210. After the switch S2 is disabled, the split gate electrode SG of the bias memory cell M0 can be discharged by enabling the switches S1 and S3.

Advantageously, the bias supply circuit 200 employing the bias memory cell M0 allows the memory device 100 to be implemented in an area efficient manner. In one implementation, a current provided to the memory cell M1 can be controlled by employing a sense amplifier and a cascode transistor coupled to the memory cell M1 in series. For example, the sense amplifier can sense a voltage at a drain electrode of the memory cell M1 (or a source electrode of the cascode transistor) and adjust a voltage at a gate electrode of the cascode transistor according to the sensed voltage. However, implementing a cascode transistor and a sense amplifier can consume a large area. In one or more embodiments disclosed herein, a current through the memory cell M1 can be controlled or adjusted according to a current through the bias memory cell M0 having similar characteristics of the memory cell M1 to ensure a stable operation (e.g., read, write, or reset) of the memory cell M1. By controlling the current through the memory cell M1 through the bias memory cell M0, the cascode transistor and the sense amplifier for the memory cell M1 can be omitted to achieve area efficiency.

In one aspect, the bias supply circuit 200 employing the memory cell M0 of the same semiconductor conductivity type or of the same transistor type as the memory cell M1 allows reduction in variations in current through the bit line BL across process, voltage, temperature (PVT) variations. For example, the current variation at the low temperature (e.g., −40° C.) due to the process and voltage variations when implementing different types of semiconductor devices for the memory cells M0, M1 may be 500%. Meanwhile, the current variation at the low temperature (e.g., −40° C.) due to the process and voltage variations when implementing the same type of semiconductor devices for the memory cells M0, M1 as disclosed herein may be reduced to 40%. For another example, the current variation at the high temperature (e.g., 150° C.) due to the process and voltage variations when implementing different types of semiconductor devices for the memory cells M0, M1 may be 500%. Meanwhile, the current variation at the high temperature (e.g., 150° C.) due to the process and voltage variations when implementing the same type of semiconductor devices for the memory cells M0, M1 as disclosed herein may be reduced to 35%.

Figure 3:
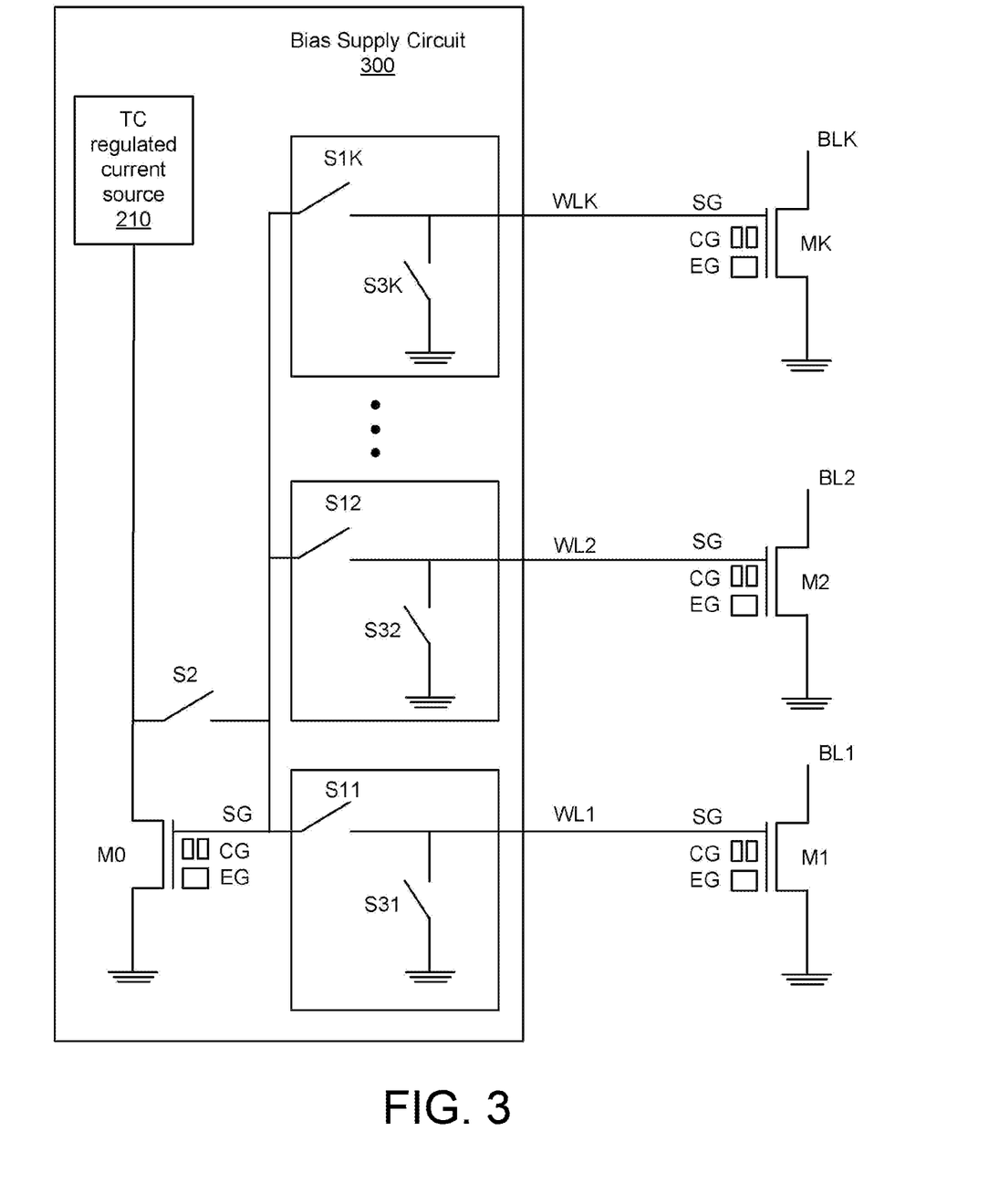
FIG. 3 is a diagram of a bias supply circuit and multiple memory cells, in accordance with one embodiment.

FIG. 3 is a diagram of a bias supply circuit 300 and multiple memory cells M1, M2 . . . MK, in accordance with one embodiment. The bias supply circuit 300 may be a bias supply circuit BSC of FIG. 1, and the memory cells M1, M2 . . . MK may be memory cells of storage circuits 125 in FIG. 1. The bias supply circuit 300 is similar to the bias supply circuit 200 of FIG. 2, except that the bias supply circuit 300 includes multiple switches S11, S12 . . . S1K and S31, S32 . . . S3K connected to the memory cells M1 M2 . . . MK through corresponding word lines WL1, WL2 . . . WLK. The switches S11, S12 . . . S1K and S31, S32 . . . S3K may be implemented as transistors (e.g., metal-oxide-semiconductor field-effect transistors or any type of transistors). The bias supply circuit 300 may include or is coupled to the analog bias generator 250 that provides various voltages to the gate electrodes CG, EG of the bias memory cell M0 and the memory cell M1. In one aspect, a pair of switches S1X and S3X are connected to a corresponding memory cell MX through a corresponding word line WLX in a similar manner as the switches S1, S3 and the memory cell M1 of FIG. 1. In one configuration, each of the switches S11, S12 . . . S1K is coupled between the split gate electrode SG of the bias memory cell M0 and a corresponding split gate electrode SG of the corresponding memory cell through a corresponding word line WL.

In one approach, the bias controller 150 can generate control signals to selectively enable or disable the switches S11, S12 . . . S1K and S31, S32 . . . S3K to provide a bias voltage at the split gate electrode SG of the bias memory cell M0 to a split gate electrode SG of a selected memory cell. For example, the bias controller 150 may enable the switch S11 to electrically couple the split gate electrode SG of the bias memory cell M0 to the split gate electrode SG of the memory cell M1, and disable the switch S31 to electrically decouple the split gate electrode SG of the memory cell M1 from the power rail, such that the bias voltage can be provided to the split gate electrode SG of the memory cell M1. In some embodiments, the bias controller 150 may configure the switches S11, S12 . . . S1K and S31, S32 . . . S3K to provide the bias voltage at the split gate electrode SG of the bias memory cell M0 to split gate electrodes SG of two or more of the memory cells M1, M2 . . . MK, sequentially or simultaneously.

In one approach, the bias controller 150 can generate control signals to selectively enable or disable the switches S11, S12 . . . S1K and S31, S32 . . . S3K to discharge the split gate electrode SG of a selected memory cell. For example, the bias controller 150 may disable the switch S12 to electrically decouple the split gate electrode SG of the bias memory cell M0 from the split gate electrode SG of the memory cell M2, and enable the switch S32 to electrically couple the split gate electrode SG of the memory cell M2 to the power rail to set a voltage at the split gate electrode SG of the memory cell M2 to a supply voltage (e.g., VSS or GND) of the power rail.

Advantageously, the bias supply circuit 300 allows the memory device 100 to be implemented in a reduced area. In one aspect, a single bias memory cell M0 can be shared by the memory cells M1, M2 . . . MK by employing the switches S11, S12 . . . S1K and S31, S32 . . . S3K. Accordingly, a number of bias memory cells for generating a bias voltage can be reduced to achieve area efficiency.

Figure 4:
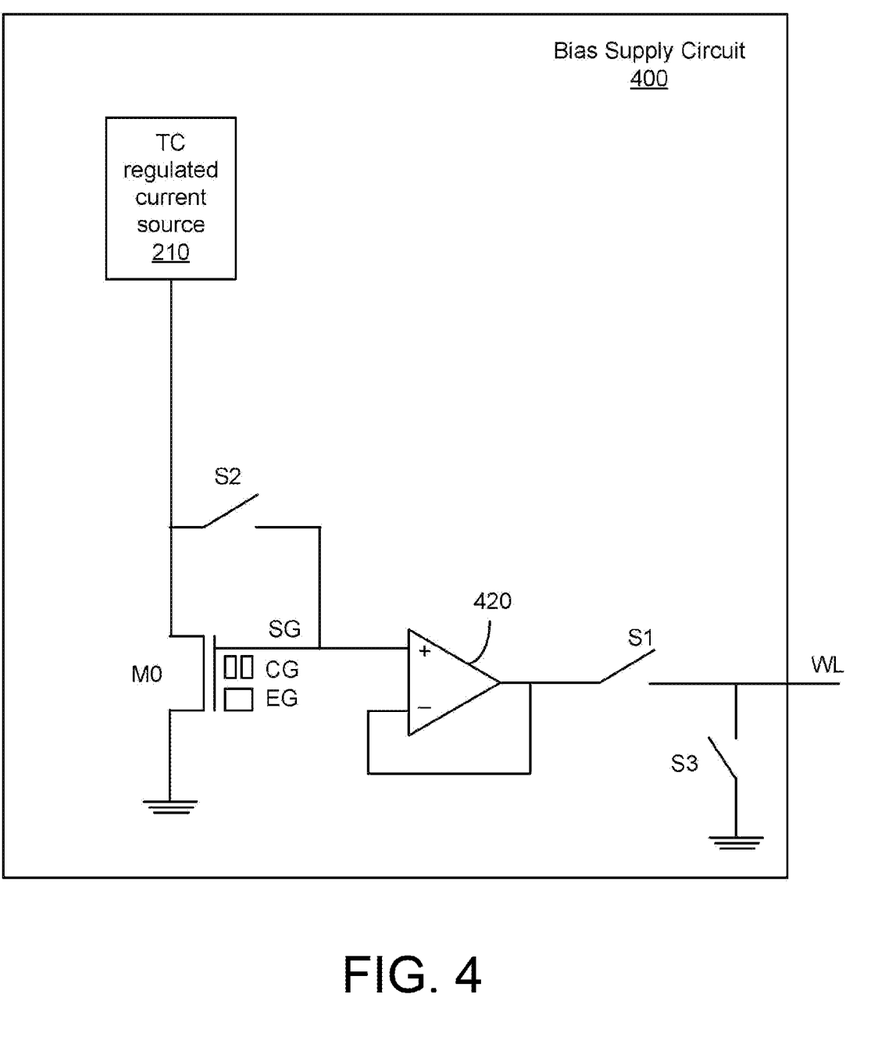
FIG. 4 is a diagram of a bias supply circuit including a buffer circuit, in accordance with one embodiment.

FIG. 4 is a diagram of a bias supply circuit 400 including a buffer circuit 420, in accordance with one embodiment. The bias supply circuit 400 may be a bias supply circuit BSC of FIG. 1. The bias supply circuit 400 is similar to the bias supply circuit 200 of FIG. 2, except that the bias supply circuit 400 includes the buffer circuit 420. The bias supply circuit 400 may include or is coupled to the analog bias generator 250 that provides various voltages to the gate electrodes CG, EG of the bias memory cell M0 and the memory cell M1. In one aspect, the buffer circuit 420 is electrically coupled between the switch S1 and the split gate electrode SG of the bias memory cell M0. In one aspect, the buffer circuit 420 is implemented as a unity gain buffer. For example, the buffer circuit 420 is implemented as an amplifier (or an operational amplifier (OPAMP)) with a positive input port coupled to the split gate electrode SG of the bias memory cell M0, a negative input port coupled to the switch S1, and an output port coupled to the switch S1. In this configuration, a voltage at the output port of the buffer circuit 420 can track a voltage at the positive input port (or the split gate electrode SG of the bias memory cell M0).

Advantageously, the buffer circuit 420 can reduce a degradation on the bias voltage at the split gate electrode SG of the bias memory cell M0 due to the switch S1. In one aspect, without the buffer circuit 420, charge injection from the switch S1 may affect or alter the bias voltage at the split gate electrode SG of the bias memory cell M0. By implementing the buffer circuit 420 as shown in FIG. 4, charge injection due to the switch S1 may not affect or degrade the bias voltage at the split gate electrode SG of the bias memory cell M0, thus the bias voltage can remain stable.

Figure 5:
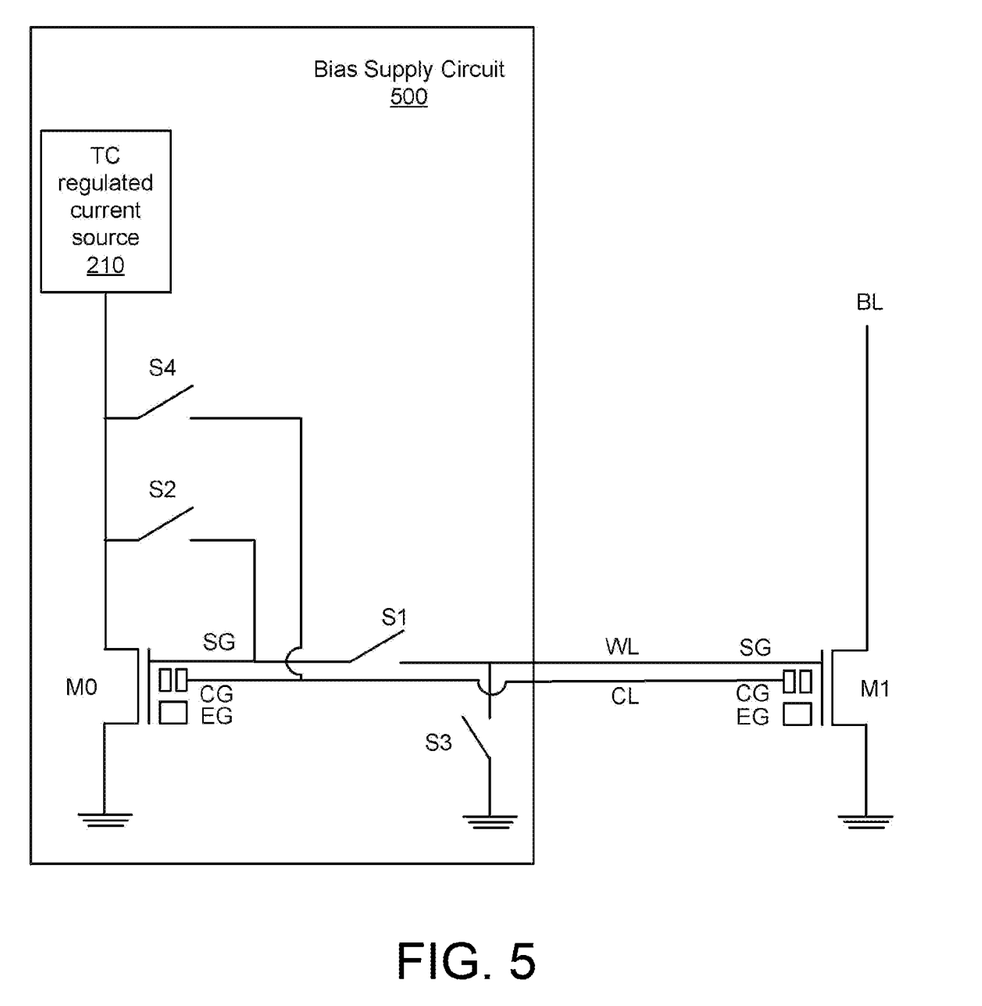
FIG. 5 is a diagram of a bias supply circuit controlling multiple gate electrodes of a memory cell, in accordance with one embodiment.

FIG. 5 is a diagram of a bias supply circuit 500 controlling multiple gate electrodes of a memory cell, in accordance with one embodiment. The bias supply circuit 500 may be a bias supply circuit BSC of FIG. 1. The bias supply circuit 500 is similar to the bias supply circuit 200 of FIG. 2, except that the bias supply circuit 500 additionally includes a switch S4 coupled between the drain electrode of the bias memory cell M0 and the control gate electrode CG of the bias memory cell M0 in a diode-connected configuration. In other embodiments, the switch S4 may be coupled between another gate electrode (e.g., erase gate electrode EG) of the bias memory cell M0. The bias supply circuit 500 may include or is coupled to the analog bias generator 250 that provides various voltages to the gate electrodes EG of the bias memory cell M0 and the memory cell M1.

By implementing the switch S4, a voltage at the control gate electrode CG of the bias memory cell M0 can be selectively configured according to a control signal from the bias controller 150. For example, the switch S4 may be enabled to electrically couple the drain electrode of the bias memory cell M0 to the control gate electrode CG of the bias memory cell M0, such that the bias memory cell M0 can generate a voltage at the control gate electrode CG of the bias memory cell M0 according to a current from the temperature coefficient regulated current source 210. For example, the switch S4 may be disabled to electrically decouple the drain electrode of the bias memory cell M0 from the control gate electrode CG of the bias memory cell M0 to electrically isolate the drain electrode of the bias memory cell M0 from the control gate electrode CG of the bias memory cell M0.

Figure 6:
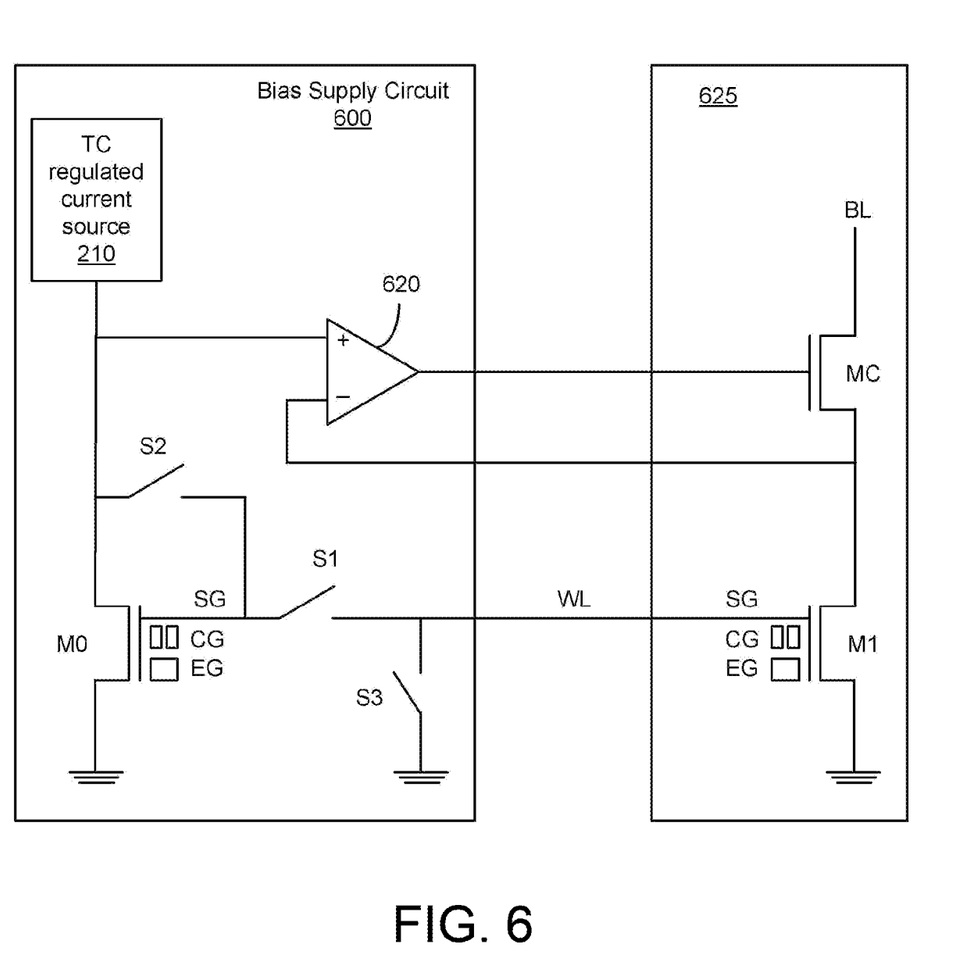
FIG. 6 is a diagram of a bias supply circuit including an amplifier circuit to control a cascode transistor of a memory cell, in accordance with one embodiment.

FIG. 6 is a diagram of a bias supply circuit 600 controlling a storage circuit 625 including a cascode transistor MC of a memory cell M1, in accordance with one embodiment. The cascode transistor MC may be implemented as a transistor (e.g., metal-oxide-semiconductor field-effect transistor or any type of transistor). In some embodiments, the bias supply circuit 600 may be a bias supply circuit BSC of FIG. 1. The bias supply circuit 600 is similar to the bias supply circuit 200 of FIG. 2, except that the bias supply circuit 600 additionally includes an amplifier 620. In addition, the storage circuit 625 includes a cascode transistor MC coupled to the memory cell M1 in series. The bias supply circuit 600 may include or is coupled to the analog bias generator 250 that provides various voltages to the gate electrodes CG, EG of the bias memory cell M0 and the memory cell M1.

In one aspect, the amplifier 620 and the cascode transistor MC operate together to provide additional control of the current through the memory cell M1. In one configuration, the amplifier 620 includes a positive input port coupled to the temperature coefficient regulated current source 210, a negative input port coupled to a source electrode of the cascode transistor MC, and an output port coupled to a gate electrode of the cascode transistor MC. In this configuration, the amplifier 620 may sense a difference between a voltage at the drain electrode of the bias memory cell M0 and a voltage at the drain electrode of the memory cell M1, and may adjust a voltage at the gate electrode of the transistor MC according to the sensed difference. For example, in response to the voltage at the drain electrode of the memory cell M1 being lower than the voltage at the drain electrode of the bias memory cell M0, the amplifier 620 may increase the voltage at the gate electrode of the cascode transistor MC, such that the voltage at the drain electrode of the memory cell M1 may increase. For another example, in response to the voltage at the drain electrode of the memory cell M1 being higher than the voltage at the drain electrode of the bias memory cell M0, the amplifier 620 may decrease the voltage at the gate electrode of the cascode transistor MC, such that the voltage at the drain electrode of the memory cell M1 may decrease. According to the adjusted voltage at the drain electrode of the memory cell M1, a corresponding current may flow through the transistor MC and the memory cell M1.

Figure 7:
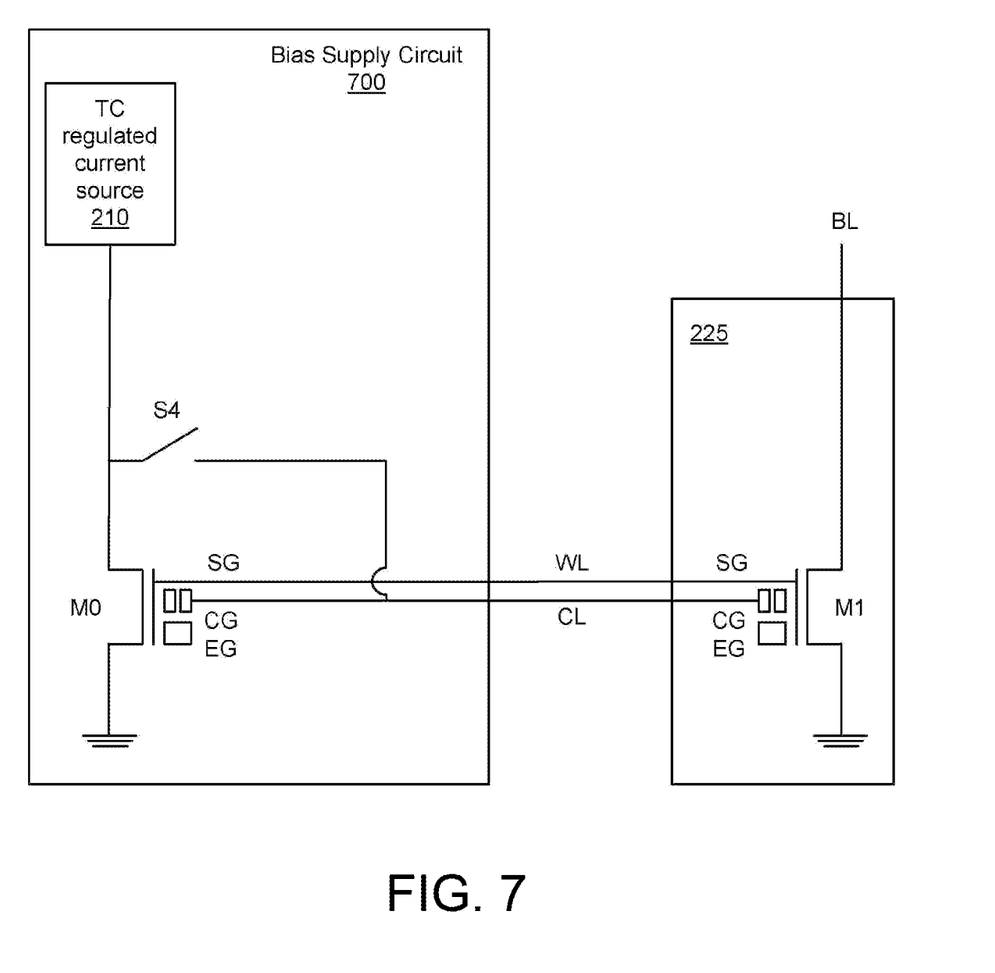
FIG. 7 is a diagram of a bias supply circuit controlling a control gate of a memory cell, in accordance with one embodiment.

FIG. 7 is a diagram of a bias supply circuit 700 controlling a control gate of a memory cell M1, in accordance with one embodiment. The bias supply circuit 700 may be a bias supply circuit BSC of FIG. 1. The bias supply circuit 700 is similar to the bias supply circuit 200 of FIG. 2, except that the switches S1, S2, S3 are omitted and the switch S4 is included. The bias supply circuit 700 may include or is coupled to the analog bias generator 250 that provides various voltages to the gate electrodes EG of the bias memory cell M0 and the memory cell M1. In one aspect, the switch S4 is coupled between the drain electrode of the bias memory cell M0 and the control gate electrode CG of the bias memory cell M0 in a diode-connected configuration. In other embodiments, the switch S4 may be coupled between another gate electrode (e.g., erase gate electrode EG) of the bias memory cell M0 and the drain electrode of the bias memory cell M0.

By implementing the switch S4, a voltage at the control gate electrode CG of the bias memory cell M0 can be selectively configured according to a control signal from the bias controller 150. For example, the switch S4 may be enabled to electrically couple the drain electrode of the bias memory cell M0 to the control gate electrode CG of the bias memory cell M0, such that the bias memory cell M0 can generate a voltage at the control gate electrode CG of the bias memory cell M0 according to a current from the temperature coefficient regulated current source 210. For example, the switch S4 may be disabled to electrically decouple the drain electrode of the bias memory cell M0 from the control gate electrode CG of the bias memory cell M0 to electrically isolate the drain electrode of the bias memory cell M0 from the control gate electrode CG of the bias memory cell M0.

Figure 8:
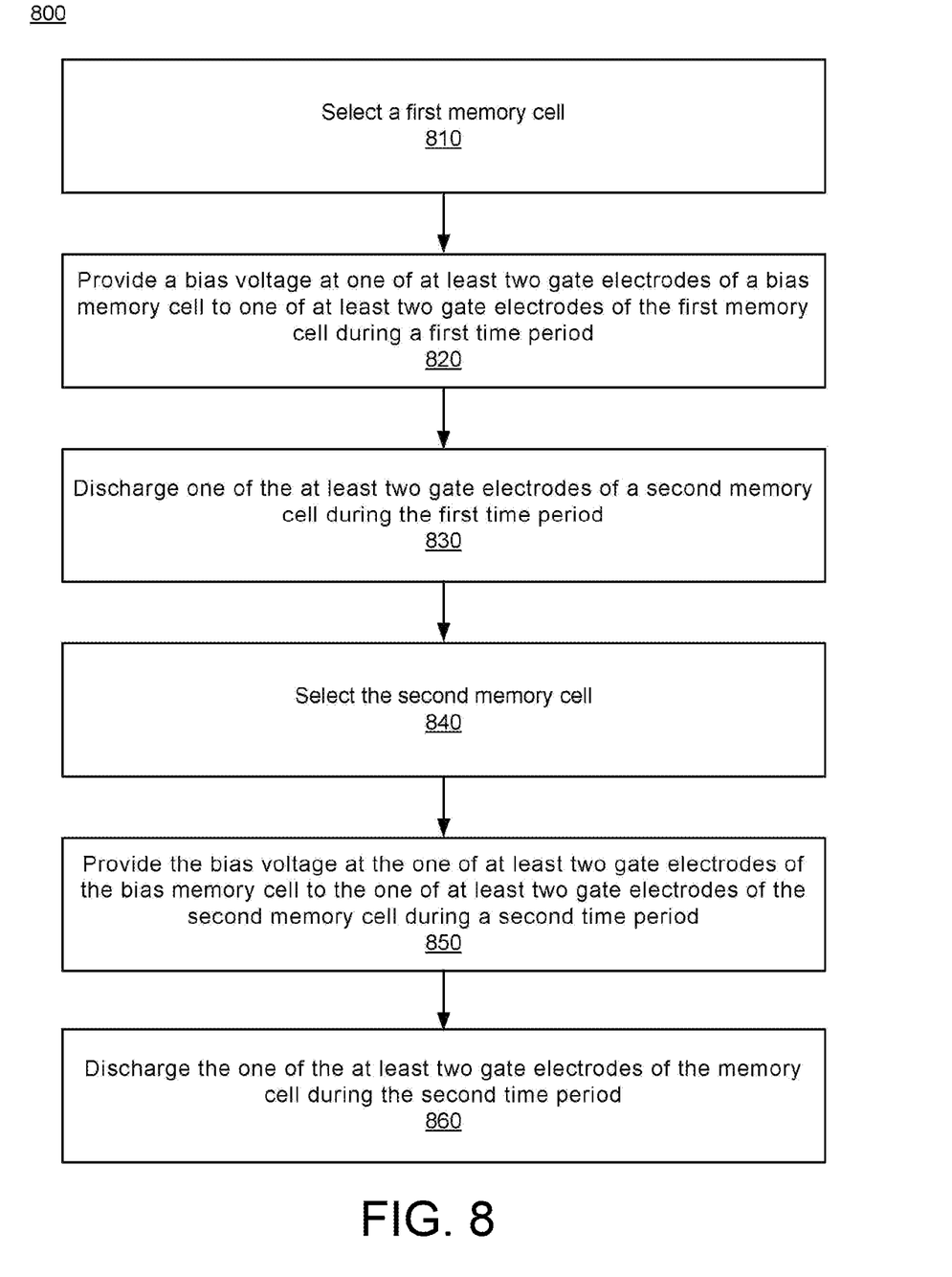
FIG. 8 is a flowchart of configuring memory cells through a bias memory cell, in accordance with some embodiments.

FIG. 8 is a flowchart of a method 800 of configuring a memory cell through a bias memory cell, in accordance with some embodiments. The method 800 may be performed by the memory controller 105 of FIG. 1. In some embodiments, the method 800 is performed by other entities. In one aspect, the method 800 is performed during a reading, writing, and/or reset. In some embodiments, the method 800 includes more, fewer, or different operations than shown in FIG. 8.

In an operation 810, the memory controller 105 selects a first memory cell M1 from a plurality of memory cells. The plurality of memory cells may be flash memory cells coupled to a bias memory cell M0. In one aspect, the bias memory cell M0 and the plurality of memory cells are of the same semiconductor conductivity type or of the same transistor type, such that the bias memory cell M0 and the plurality of memory cells have the same characteristics. The bias memory cell M0 may be in a diode-connected configuration. In this configuration, the bias memory cell M0 can generate a bias voltage according to a current injected at a drain electrode of the bias memory cell M0. For example, the bias memory cell M0 may generate the bias voltage, according to the current injected from the temperature coefficient regulated current source 210. Each of the plurality of memory cells may be coupled to the bias memory cell M0 through a corresponding pass-through switch. Moreover, each of the plurality of memory cells may be coupled to a power rail for providing a supply voltage (e.g., VSS or GND) through a discharge switch.

In an operation 820, the memory controller 105 provides a bias voltage at one of at least two gate electrodes of as bias memory cell M0 to one of at least two gate electrodes of the selected first memory cell M1 during a first time period. Another one of the at least two gate electrodes of the selected first memory cell M1 may be directly coupled to another one of the at least two gate electrodes of the bias memory cell M0 without any active component (e.g., switch) between them. The memory controller 105 may electrically couple the bias memory cell M0 to the selected first memory cell M1 during a first time period. For example, the memory controller 105 enables a pass-through switch (e.g., switch S11) between the one of the at least two gate electrodes of the bias memory cell M0 and the one of the at least two gate electrodes of the selected first memory cell M1 and disables a discharge switch (e.g., switch S31) between the one of the at least two gate electrodes of the selected first memory cell M1 and the power rail, during the first time period.

In an operation 830, the memory controller 105 discharges one of the at least two gate electrodes of a second memory cell M2 during the first time period. For example, the memory controller 105 disables a pass-through switch (e.g., switch S12) between the one of the at least two gate electrodes of the bias memory cell M0 and the one of the at least two gate electrodes of the second memory cell M2 and enables a discharge switch (e.g., switch S32) between the one of the at least two gate electrodes of the second memory cell M2 and the power rail, during the first time period. Another one of the at least two gate electrodes of the second memory cell M2 may be directly coupled to the another one of the at least two gate electrodes of the bias memory cell M0 without any active component (e.g., switch) between them. Accordingly, the bias voltage can be provided to the gate electrode of the first memory cell M1 but not to the gate electrode of the second memory cell M2, during the first time period.

In an operation 840, the memory controller 105 selects a second memory cell M2. The memory controller 105 may unselect the first memory cell M1.

In an operation 850, the memory controller 105 provides the bias voltage at the one of the at least two gate electrodes of the bias memory cell M0 to the one of the at least two gate electrodes of the selected second memory cell M2 during a second time period. The memory controller 105 may electrically couple the bias memory cell M0 to the selected second memory cell M2 during the second time period. For example, the memory controller 105 enables the pass-through switch (e.g., switch S12) between the one of the at least two gate electrodes of the bias memory cell M0 and the one of the at least two gate electrodes of the selected second memory cell M2 and disables a discharge switch (e.g., switch S32) between the one of the at least two gate electrodes of the selected second memory cell M2 and the power rail, during the second time period.

In an operation 860, the memory controller 105 discharges the one of the at least two gate electrodes of the first memory cell M1 during the second time period. For example, the memory controller 105 disables the pass-through switch (e.g., switch S11) between the one of the at least two gate electrodes of the bias memory cell M0 and the one of the at least two gate electrodes of the first memory cell M1 and enables a discharge switch (e.g., switch S31) between the one of the at least two gate electrodes of the first memory cell M1 and the power rail, during the second time period. Accordingly, the bias voltage can be provided to the gate electrode of the second memory cell M2 but not to the gate electrode of the first memory cell M1, during the second time period.

Although the method 800 is described as sequentially providing a bias voltage to the memory cells (e.g., M1, M2) during different time period, in some embodiments, the bias voltage can be provided to different memory cells in a different manner. In one example, the bias voltage can be provided to the different memory cells (e.g., M1, M2) simultaneously during the same time period. In one example, the bias voltage can be provided to the different memory cells (e.g., M1, M2) during different time periods that partially overlap with each other.

Advantageously, generating a bias voltage by the bias memory cell M0 and selectively providing the bias voltage to one or more memory cells allow a memory device to be implemented in an area efficient manner. In one aspect, a single bias memory cell M0 can be shared by the memory cells M1, M2 . . . MK by employing the switches S11, S12 . . . S1K and S31, S32 . . . S3K. Accordingly, a number of bias memory cells for generating a bias voltage can be reduced to achieve area efficiency.

Figure 9:
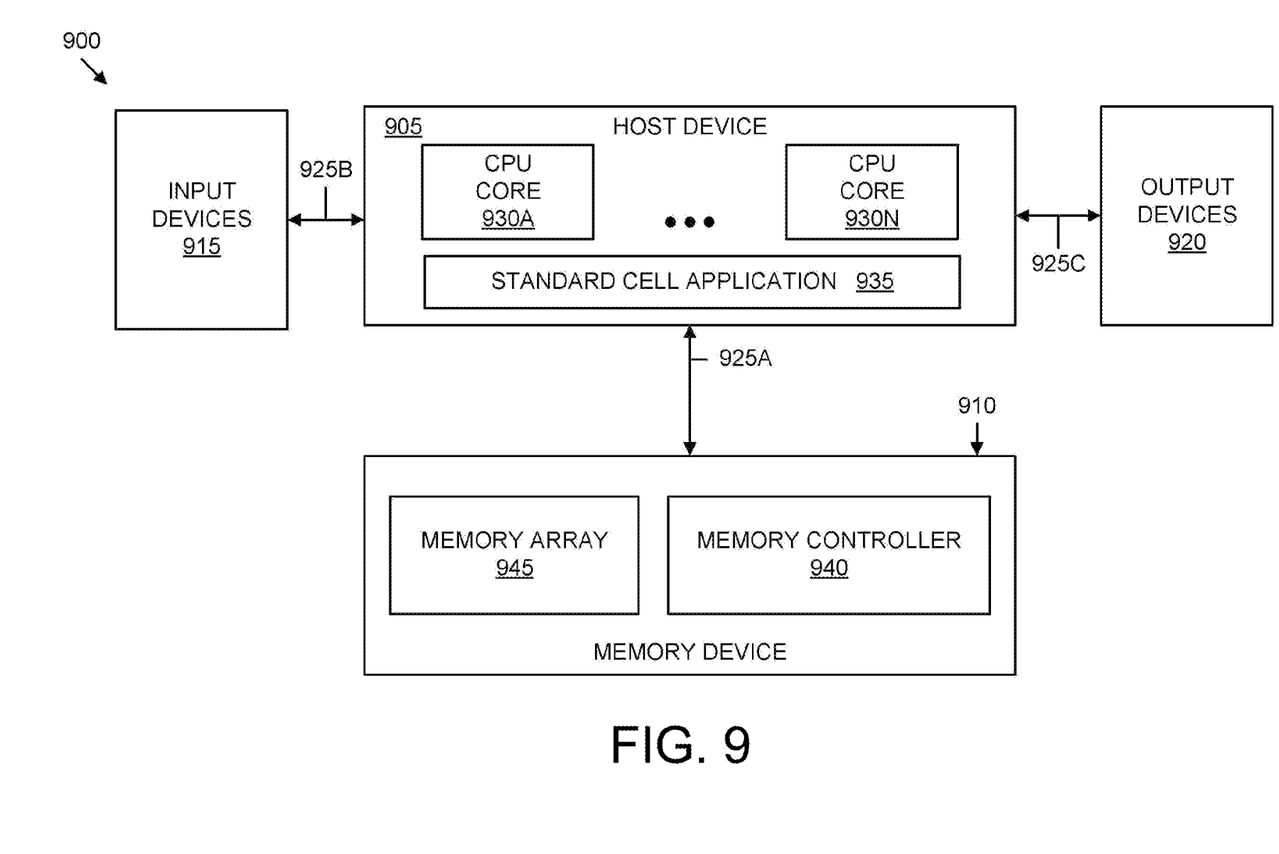
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory device 100 or a portion of the memory device 100 to aid integrated circuit design. After the layout design of the integrated circuit is complete, multiples of the integrated circuit, for example, including the memory device 100 or a portion of the memory device 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to a memory device. In some embodiments, the memory device includes a memory cell including at least two gate electrodes. In some embodiments, the memory device includes a bias supply circuit to provide a bias voltage to one of the at least two gate electrodes of the memory cell. The bias supply circuit may include a bias memory cell including at least two gate electrodes and a drain electrode, where one of the at least two gate electrodes of the bias memory cell and the drain electrode of the bias memory cell may be coupled to each other. In one aspect, the memory cell and the bias memory cell are of the same semiconductor conductivity type or of the same transistor type.

One aspect of this description relates to a method of operating a memory device. In some embodiments, the method includes providing a bias voltage at one of at least two gate electrodes of a bias memory cell to one of at least two gate electrodes of a memory cell during a first time period. A drain electrode of the bias memory cell may be coupled to the one of the at least two gate electrodes of the bias memory cell. In one aspect, the bias memory cell and the memory cell are of the same semiconductor conductivity type or of the same transistor type. In some embodiments, the method includes discharging the one of the at least two gate electrodes of the memory cell during a second time period.

One aspect of this description relates to a memory device. In some embodiments, the memory device includes a memory cell including a first gate electrode and a second gate electrode. In some embodiments, the memory device includes a bias supply circuit coupled to the memory cell. In some embodiments, the bias supply circuit includes a bias memory cell having a first gate electrode, a gate second electrode, and a drain electrode, where the drain electrode of the bias memory cell is coupled to the first gate electrode of the bias memory cell and the first gate electrode of the memory cell. The second gate electrode of the bias memory cell may be directly coupled to the second gate electrode of the memory cell through a gate line without any active component between the second gate electrode of the bias memory cell and the second gate electrode of the memory cell. In some embodiments, the bias supply circuit includes a first switch to electrically couple or decouple between the first gate electrode of the bias memory cell and the first gate electrode of the memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory cell including at least two gate electrodes, one of the at least two gate electrodes coupled to a word line;
   a bias memory cell to generate a bias voltage;
   a first switch to selectively couple the bias memory cell to the word line;
   a second switch to selectively discharge the one of the at least two gate electrodes; and
   a controller to:
   enable the first switch and disable the second switch during a first time period to provide the bias voltage to the one of the at least two gate electrodes through the word line, and
   disable the first switch and enable the second switch during a second time period to discharge the one of the at least two gate electrodes.

2. The memory device of claim 1, wherein the memory cell and the bias memory cell are of a same semiconductor conductivity type.

3. The memory device of claim 1, wherein the controller is to enable the second switch during the second time period to electrically couple the one of the at least two gate electrodes to a power rail.

4. The memory device of claim 1, further comprising:
   a third switch to selectively couple a drain electrode of the bias memory cell to a gate electrode of the bias memory cell,
   wherein the controller is to:
   enable the third switch during the first time period to electrically couple the drain electrode of the bias memory cell to the gate electrode of the bias memory cell to generate the bias voltage, and
   disable the third switch during a third time period after the second time period to electrically decouple the drain electrode of the bias memory cell from the gate electrode of the bias memory cell.

5. The memory device of claim 4, wherein the controller is to:
   enable the first switch and the second switch during the third time period to discharge the gate electrode of the bias memory cell.

6. The memory device of claim 4, further comprising:
   a temperature coefficient regulated current source to provide regulated current to the drain electrode of the bias memory cell across a temperature range.

7. The memory device of claim 1, further comprising:
   another memory cell including at least two gate electrodes, one of the at least two gate electrodes of the another memory cell coupled to another word line;
   a third switch to selectively couple the bias memory cell to the another word line; and
   a fourth switch to selectively discharge the one of the at least two gate electrodes of the another memory cell,
   wherein the controller is to:
   enable the third switch and disable the fourth switch during a third time period to provide the bias voltage to the one of the at least two gate electrodes of the another memory cell through the another word line, and
   disable the third switch and enable the fourth switch during a fourth time period to discharge the one of the at least two gate electrodes of the another memory cell.

8. The memory device of claim 1, further comprising:
   a cascode transistor coupled to the memory cell in series; and
   an amplifier circuit coupled to the memory cell, the bias memory cell, and the cascode transistor, wherein the amplifier circuit is to adjust a voltage at a drain electrode of the memory cell according to the bias voltage at the drain electrode of the bias memory cell.

9. The memory device of claim 1, wherein the bias memory cell includes:
   a first gate electrode coupled to the first switch, and
   a second gate electrode coupled to another one of the at least two gate electrodes of the memory cell, wherein a threshold voltage of the memory cell is controlled according to a voltage at the second gate electrode of the bias memory cell.

10. The memory device of claim 9, further comprising:
    a third switch to selectively couple a drain electrode of the bias memory cell to the one of the first gate electrode of the bias memory cell; and
    a fourth switch to selectively couple the drain electrode of the bias memory cell to the second gate electrode of the bias memory cell.

11. A memory device comprising:
    a bias memory cell to generate a bias voltage, the bias memory cell including at least two gate electrodes;
    a buffer circuit coupled to one of the at least two gate electrodes of the bias memory cell;
    a first switch to selectively couple the buffer circuit to a word line; and
    a second switch to selectively couple the word line to a power rail.

12. The memory device of claim 11, wherein the buffer circuit is to reduce charge injection from the first switch to the bias memory cell.

13. The memory device of claim 11, wherein the buffer circuit is a unity gain buffer circuit.

14. The memory device of claim 11, wherein the buffer circuit includes:
    a first input coupled to the one of the at least two gate electrodes; and
    a second input coupled to an output of the buffer circuit and the first switch.

15. The memory device of claim 14, further comprising:
    a memory cell including at least two gate electrodes, one of the at least two gate electrodes of the memory cell coupled to the word line.

16. The memory device of claim 15, wherein the memory cell and the bias memory cell are of a same semiconductor conductivity type.

17. The memory device of claim 11, further comprising:
    a third switch to selectively couple a drain electrode of the bias memory cell to the one of the at least two gate electrodes of the bias memory cell.

18. A memory device comprising:
    a first memory cell including at least two first gate electrodes, one of the at least two first gate electrodes coupled to a first word line;
    a second memory cell including at least two second gate electrodes, one of the at least two second gate electrodes coupled to a second word line;
    a bias memory cell including at least two third gate electrodes, the bias memory cell to generate a bias voltage at one of the at least two third gate electrodes;
    a first switch to selectively couple one of the at least two third gate electrodes of the bias memory cell to the one of the at least two first gate electrodes of the first memory cell through the first word line; and
    a second switch to selectively couple the one of the at least two third gate electrodes of the bias memory cell to the one of the at least two second gate electrodes of the second memory cell through the second word line.

19. The memory device of claim 18, further comprising:
a third switch to selectively discharge the one of the at least two first gate electrodes of the first memory cell coupled to the first word line; and
a fourth switch to selectively discharge the one of the at least two second gate electrodes of the second memory cell coupled to the second word line.

20. The memory device of claim 18, wherein the memory cell and the bias memory cell are of a same semiconductor conductivity type.

* * * * *